United States Patent [19]

McKerreghan

[11] 3,781,457

[45] Dec. 25, 1973

[54] GLASS DUAL-IN-LINE HEADER

[75] Inventor: Michael H. McKerreghan, Richardson, Tex.

[73] Assignee: Texas Instruments Incorporated, Dallas, Tex.

[22] Filed: May 26, 1972

[21] Appl. No.: 257,271

[52] U.S. Cl. ........ 174/52 S, 174/50.6, 317/101 CP, 317/234 G

[51] Int. Cl. ........................................... H05k 5/00

[58] Field of Search...................... 174/DIG. 3, 52 S, 174/52 PE, 50.6, 50.61; 317/101 A, 101 CC, 101 CP, 234 G, 234 F, 234 E, 234 M, 234 N; 26/625, 626, 588–598

[56] References Cited

UNITED STATES PATENTS

| | | | |
|---|---|---|---|
| 3,482,419 | 12/1969 | Rogers et al. | 174/DIG. 3 UX |
| 3,524,249 | 8/1970 | Hamada et al. | 174/DIG. 3 UX |
| 3,546,543 | 12/1970 | Hessinger | 174/DIG. 3 UX |
| 3,604,989 | 9/1971 | Haneta et al. | 317/234 M UX |

*Primary Examiner*—Darrell L. Clay
*Attorney*—Harold Levine et al.

[57] ABSTRACT

The disclosure relates to a glass or ceramic filled glass dual-in-line header wherein the leads on the lead frame extend perpendicular to the plane of the glass and closely adjacent the sides of the glass during fabrication. The leads of the lead frame are bonded to the glass along three surfaces thereof to provide superior standoff sheer reliability and resistance to header cracking, resulting in loss of hermeticity. The glass on the upper surface of the lead frame extends to the edge of the header. A larger cavity for reception of a semiconductor chip is provided due to smaller lead lengths on the glass surface. The leads of the lead frame include a window which extends within the glass and outwardly, thereby providing a seal within the window to provide stronger lead anchoring and to provide the header with better stress capability.

2 Claims, 5 Drawing Figures

PATENTED DEC 25 1973 3,781,457

SHEET 1 OF 3

GLASS DUAL-IN-LINE HEADER

This invention relates to an improved glass dual-in-line header and, more specifically, to a header for use with semiconductor chips having a larger bar mount area than similar prior art headers and providing a header having a superior lead fatigue property and standoff sheer reliability relative to prior art glass headers.

An appreciable factor in the cost of fabrication of semiconductor packages, and particularly those packages emobdying integrated circuits, is involved in the cost of header construction. Of the headers used in the prior art, the ceramic D.I.P. headers have displayed excellent strength properties, and have had a high semiconductor bar or chip ratio to package size. Ceramic headers, however, have been very costly. It has therefore been the desire of the industry to produce headers of lower cost which still approach the properties of the ceramic headers. One such approach is known as a glass or ceramic filled glass D.I.P. header. Prior art headers of this type, though relatively less expensive to produce than the ceramic headers, are more subject to fracture from mishandling since glass has a low tensile strength and the leads come directly out of the glass package. Furthermore, such prior art glass headers require a substantial bonding area to the glass and therefore have a smaller cavity for reception of semiconductor chips than do the ceramic headers. For this reason the glass headers have a relatively low semiconductor chip size to package ratio.

In accordance with the present invention, the above problems of the prior art are overcome by providing a relatively inexpensive header of the glass or ceramic filled glass variety, the header being formed from a lead frame having a series of windows in the leads at the piont of entry into the glass, the glass being bonded to the leads at three different major lead surfaces, and the edges thereby providing superior lead fatigue properties and superior standoff sheer reliability. In addition, due to the bonding on three different surfaces of the lead frame to the glass, the bonding area extending inwardly into the header can be minimized, thereby permitting a larger area for reception of a semiconductor bar or chip relative to prior art headers of the same size and permitting a larger chip to package size ratio.

It is therefore an object of this invention to provide an improved glass dual-in-line header having superior standoff sheer reliability relative to prior art glass headers.

It is a further object of this invention to provide an improved glass dual-in-line header having superior resistance to fracturing and loss of hermeticity relative to prior art glass headers.

It is a yet further object of this invention to provide an improved glass dual-in-line header which requires no bending of leads during or subsequent to production and fabrication of the header assembly.

It is a yet further object of this invention to provide an improved glass dual-in-line header wherein the leads are bonded to the glass on three different lead surfaces.

It is a yet further object of this invention to provide an improved glass dual-in-line header formed from a lead frame having windows therein, the windows extending from outside the header into the header to provide superior lead anchoring and provide the header with better standoff sheer reliability.

It is a yet further object of this invention to provide a glas dual-in-line header wherein the glass on the upper surface of the header extends outwardly to the outer edges of the header assembly.

The above objects and still further objects of the invention will immediately become apparent to those skilled in the art after consideration of the following preferred embodiments thereof, which is provided by way of example and not by way of limitation, wherein.

Figure 1:
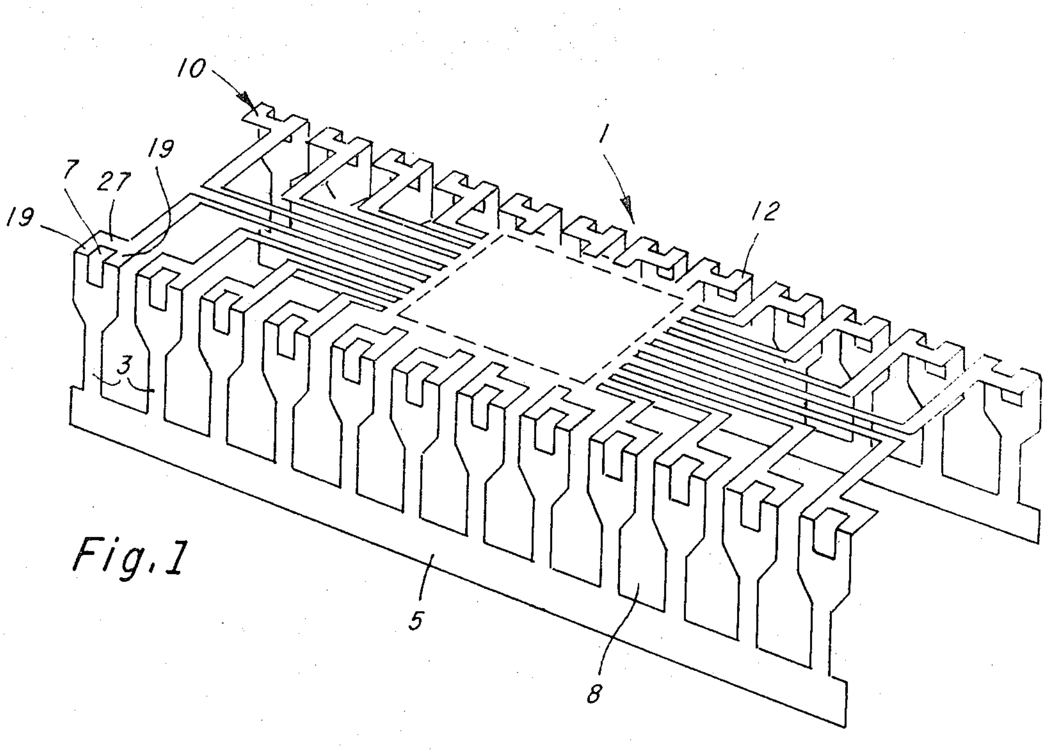
FIG. 1 is a view in elevation of a lead frame which is used in accordance with the present invention.

Referring first to FIG. 1, there is shown a lead frame 1 which is formed of any suitable well-known material from which lead frames are made. The lead frame 1 has been bent into a substantially rectangular shape, the lead frame including a plurality of leads 3 extending outwardly and connected together by end rails 5. Each of the leads 3 includes a window 7 therein, each window extending along one of the 8 and 12 sides and the top 10 of the header as shown in FIG. 1.

A header is formed using the lead frame 1 of FIG. 1 by oxidizing and placing the lead frame and other components in a graphite boat and heating in well-known manner. A preferred arrangement of lead frame and other components is shown in FIG. 5 wherein a lower rectangular glass or ceramic filled glass member 14 is placed in the boat with the lead frame 1 positioned thereover, the leads 3 and end rails 5 extending into a cavity so that the lead frame is in intimate contact with the glass member 14. A second rectangular glass member 16 having a central aperture 18 is positioned over the lead frame and a ring frame 20 is positioned over the glass member 16. A plug is then placed in the boat to extend into the aperture 18 in well-known manner and the entire boat and header elements are heated in a furnace to about 1,000°C. The glass will melt and bond to the lead frame to provide a glass-to-metal seal as well as to other glass through the windows 7 and the ring frame 20 in well-known manner. The portions of the lead frame 1 adjacent the glass become inlaid in the glass such that the outer metal surface and the glass are coplanar. The header is then cooled, cleaned to remove oxides and plated with gold or silver, or some other type of acceptable protective metal. The header is then completed and available for manufacture of a semiconductor package. The resulting header is shown in FIGS. 2–4.

Figure 2:
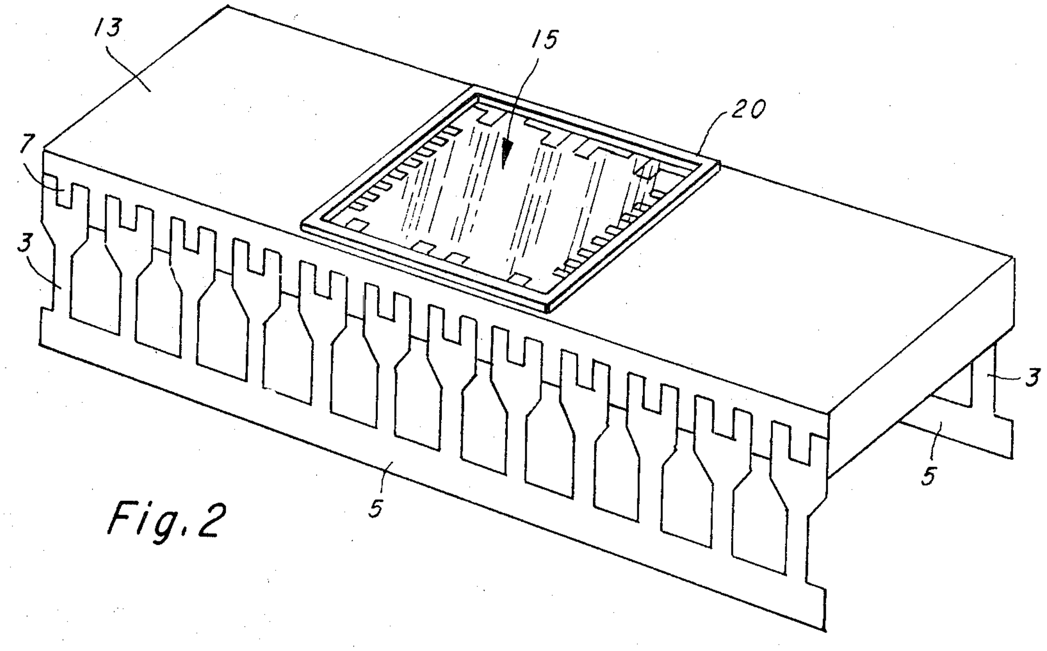
FIG. 2 is a view in elevation of a completed header in accordance with the present invention.
Figure 3:
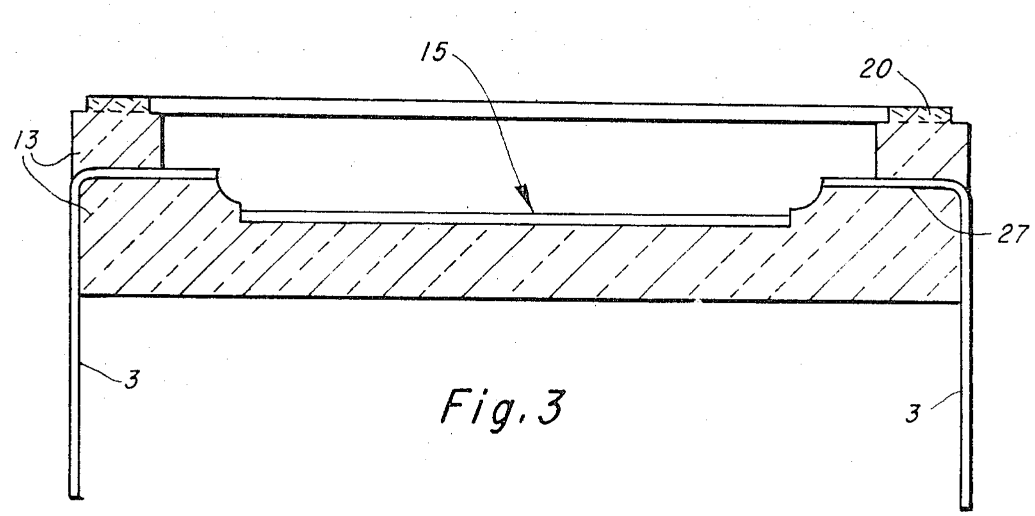
FIG. 3 is a cross-section taken along the line 3—3 of FIG. 2.
Figure 4:
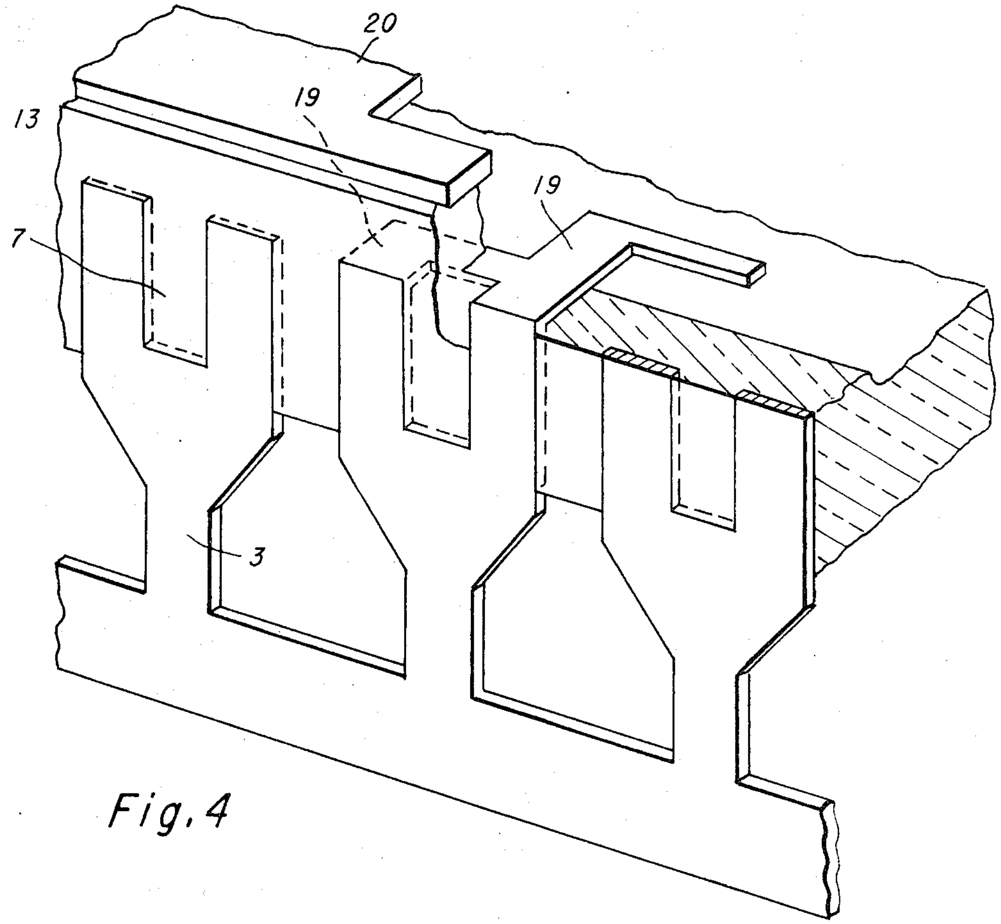
FIG. 4 is an enlarged view partially in elevation and partially in section taken through the center of the header of FIG. 2.
Figure 5:
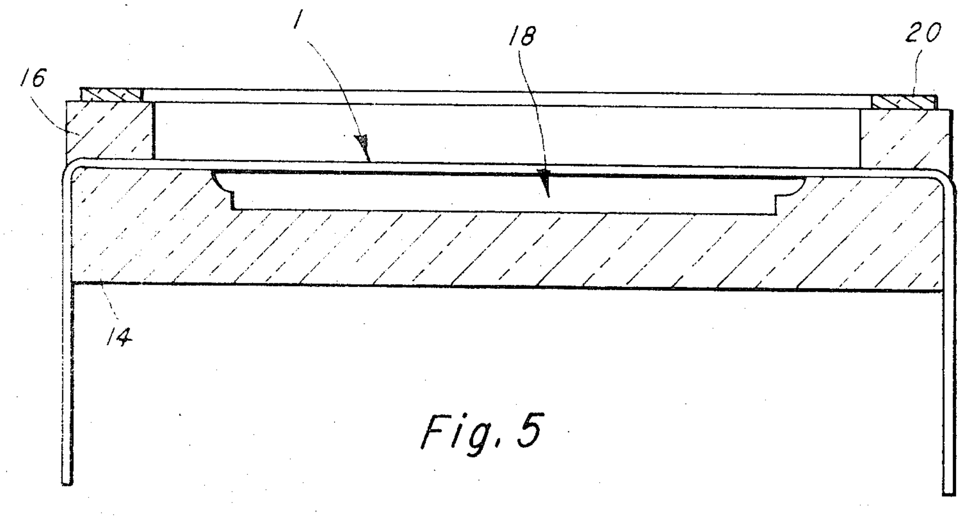
FIG. 5 is a cross-section showing the components of the header of the present invention as they would be placed in a boat prior to heating.

Referring now to FIGS. 2 and 4, there is shown the completed header having glass 13 which is formed from the fusion of the upper and lower glass members 14 and 16 through the windows 7 and between adjacent leads 3. The lead frame is bonded to the glass 13, the windows 7 extending partially into the glass as best shown in FIGS. 2 and 4 with the end rails 5 still in place and with the semiconductor chip or bar receiving area 15 formed in the upper surface thereof with metal ring frame 20 secured therein in the glass.

Referring now more specifically to FIGS. 3 and 4, it can again be seen that during the fusing or heating operation, the upper and lower glass portions 14 and 16 of FIG. 5 fuse through the windows 7 and between adjacent leads 3 so that glass completely surrounds the fingers 19 of the window 7 and is secured to said fingers. In addition, the glass 13 is secured to both the top and bottom of the upper surface 10 of the lead frame 1 as well as to the sides 8 and 12 thereof. It can therefore be seen that the lead frame 1 is bonded to the glass 13 at three surfaces thereof, two of which are perpendicular. In view of this three-sided bonding of the lead frame 1 to the glass 13, the length of the lead frame portion 27 which is bonded to the glass 13 can be shortened and thereby still provide extreme strength relative to the prior art headers. For this reason, the cavity 15 in which semiconductor chips and bars are to be positioned for connection can be greatly enlarged relative to the prior art headers. This shortening of the portion 27 is also made possible by the fact that the glass on the upper portion of the lead frame 1 can be positioned to extend to the outer horizontal surface of the lead frame since the lead frame does not require bending after fabrication.

The resulting glass dual-in-line header is of low cost due to the use of glass rather than ceramic and still provides the beneficial attributes of the ceramic header relative to the ratio of chip size to header size. Furthermore, due to the use of the windows, it is necessary to actually sheer the glass in order to break the package, tension itself not providing breakage as in the case of prior art glass type headers. Furthermore, the above described design eliminates the lever arm portion of the lead frame between the body and the bend at the shoulder of prior art headers, thereby making the above described header less subject to damage and destruction relative to the prior art headers.

Although the invention has been described with respect to a specific preferred embodiment thereof, many variations and modifications thereof will immediately become apparent to those skilled in the art. It is therefore the intention that the appended claims be interpreted as broadly as possible in view of the prior art to include all such variations and modifications.

Having described the invention in accordance with applicable United States statutes, I claim:

1. A header for use with semiconductor devices comprising:

a lead frame including a plurality of leads, said lead frame having a substantially planar central area and respective opposite substantially planar side areas integral with said central area and arranged in perpendicular relationship with respect thereto and extending in the same direction, each of said leads included in said lead frame having a portion thereof disposed in the planar central area of said lead frame and having with a bend therein to dispose the remaining lead portion thereof in one of the opposite side areas of said lead frame, each of said leads having with an opening extending therethrough and located across said bend in said lead defining a window extending across said bend, a body of glass bonded to said lead frame along three different planes so as to encase said central area of said lead frame and partially encasing the opposite side areas of said lead frame, said glass body extending through the respective windows in each of said leads and filling said windows presenting opposite sides of said glass body in substantially flush relationship with the portions of said leads disposed in the opposite side areas of said lead frame.

2. A header as set forth in claim 1 wherein each of said leads has an intermediate enlarged area located on opposite sides of the bend therein and in which the window-defining opening is located.

* * * * *